United States Patent
Han et al.

(10) Patent No.: US 10,163,508 B2
(45) Date of Patent: Dec. 25, 2018

(54) SUPPORTING MULTIPLE MEMORY TYPES IN A MEMORY SLOT

(71) Applicant: Intel Corporation, Santa Clara, CA (US)

(72) Inventors: Woojong Han, Phoenix, AZ (US); Mohamed Arafa, Chandler, AZ (US); Brian S. Morris, Santa Clara, CA (US); Mani Prakash, University Place, WA (US); James K. Pickett, Austin, TX (US); John K. Grooms, Webster, MA (US); Bruce Querbach, Hillsboro, OR (US); Edward L Payton, Olympia, WA (US); Dong Wang, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 67 days.

(21) Appl. No.: 15/055,153

(22) Filed: Feb. 26, 2016

(65) Prior Publication Data
US 2017/0249991 A1    Aug. 31, 2017

(51) Int. Cl.
| | | |
|---|---|---|
| G11C 5/06 | (2006.01) | |
| G11C 14/00 | (2006.01) | |
| G11C 5/02 | (2006.01) | |
| G11C 5/14 | (2006.01) | |

(52) U.S. Cl.
CPC ............ G11C 14/0009 (2013.01); G11C 5/02 (2013.01); G11C 5/141 (2013.01)

(58) Field of Classification Search
CPC ........ G11C 14/0009; G11C 5/141; G11C 5/02
See application file for complete search history.

(56) References Cited

U.S. PATENT DOCUMENTS

| | | |
|---|---|---|
| 4,148,099 A | 4/1979 | Lauffer et al. |
| 5,555,250 A | 9/1996 | Walker et al. |
| 5,613,078 A | 3/1997 | Kishigami |
| 5,805,905 A | 9/1998 | Biswas et al. |
| 6,260,101 B1 | 9/2001 | Hansen et al. |
| 6,457,081 B1 | 9/2002 | Gulick |
| 6,625,685 B1 | 9/2003 | Cho et al. |

(Continued)

FOREIGN PATENT DOCUMENTS

| | | |
|---|---|---|
| CN | 1433025 A | 7/2003 |
| CN | 102096611 A | 6/2011 |

(Continued)

OTHER PUBLICATIONS

International Search Report and Written Opinion received for International Application No. PCT/US2017/012216, dated Apr. 14, 2017, 12 pages.

(Continued)

*Primary Examiner* — Mohammed A Bashar
(74) *Attorney, Agent, or Firm* — Spectrum IP Law Group LLC

(57) ABSTRACT

Methods and apparatus related to supporting both DDR (Double Data Rate) and NVM (Non-Volatile Memory) DIMM (Dual Inline Memory Module) on the same memory slot are described. In one embodiment, a DIMM comprises volatile memory and non-volatile memory, and data is communicated with the volatile memory and the non-volatile memory via a single memory slot. Other embodiments are also disclosed and claimed.

29 Claims, 7 Drawing Sheets

(56) References Cited

U.S. PATENT DOCUMENTS

| | | |
|---|---|---|
| 6,683,884 B1 | 1/2004 | Howard |
| 6,795,354 B2 | 9/2004 | Cho et al. |
| 7,177,989 B1 | 2/2007 | McGinnis |
| 7,254,688 B2 | 8/2007 | Uneme |
| 7,966,439 B1 | 6/2011 | Treichler et al. |
| 8,272,781 B2 | 9/2012 | Nale |
| 8,296,496 B2 | 10/2012 | Mogul et al. |
| 8,410,819 B2 | 4/2013 | Himpe |
| 8,665,665 B2 | 3/2014 | Huang |
| 8,862,973 B2 | 10/2014 | Bains et al. |
| 8,930,647 B1 | 1/2015 | Smith |
| 2002/0002662 A1 | 1/2002 | Olarig et al. |
| 2004/0177262 A1 | 9/2004 | Lee |
| 2004/0250053 A1 | 12/2004 | McGrath et al. |
| 2005/0002259 A1 | 1/2005 | Suyarna |
| 2005/0010710 A1 | 1/2005 | Yim et al. |
| 2005/0120079 A1 | 6/2005 | Anderson et al. |
| 2006/0015660 A1 | 1/2006 | Nguyen et al. |
| 2006/0262608 A1 | 11/2006 | Babb et al. |
| 2007/0051536 A1 | 3/2007 | Ivanov |
| 2007/0250756 A1 | 10/2007 | Gower et al. |
| 2008/0059829 A1 | 3/2008 | Boskovic |
| 2008/0126664 A1 | 5/2008 | Chan et al. |
| 2008/0155141 A1 | 6/2008 | LaBerge |
| 2008/0205446 A1 | 8/2008 | Popescu et al. |
| 2008/0235444 A1 | 9/2008 | Gower et al. |
| 2009/0006691 A1 | 1/2009 | Eggleston |
| 2009/0041057 A1 | 2/2009 | Dickens et al. |
| 2009/0070612 A1 | 3/2009 | Adelman et al. |
| 2009/0207850 A1 | 8/2009 | Osano et al. |
| 2009/0225623 A1 | 9/2009 | Walker |
| 2009/0276597 A1 | 11/2009 | Reed |
| 2009/0327800 A1 | 12/2009 | Kim |
| 2010/0049935 A1 | 2/2010 | Pichumani et al. |
| 2010/0162020 A1 | 6/2010 | Maule et al. |
| 2010/0318840 A1 | 12/2010 | Tsai |
| 2011/0072201 A1 | 3/2011 | Lee et al. |
| 2011/0090754 A1 | 4/2011 | Kim et al. |
| 2011/0113208 A1 | 5/2011 | Jouppi et al. |
| 2011/0138261 A1 | 6/2011 | Bains et al. |
| 2011/0153903 A1* | 6/2011 | Hinkle .............. G06F 13/20 710/313 |
| 2011/0161568 A1 | 6/2011 | Bruce et al. |
| 2011/0185256 A1 | 7/2011 | Nygren et al. |
| 2011/0208900 A1* | 8/2011 | Schuette ............ G06F 12/0866 711/103 |
| 2011/0219285 A1 | 9/2011 | Nakamura |
| 2011/0246791 A1 | 10/2011 | Kambayashi et al. |
| 2011/0296214 A1 | 12/2011 | Amtzen et al. |
| 2011/0320869 A1 | 12/2011 | Gower et al. |
| 2012/0030396 A1 | 2/2012 | Zhu et al. |
| 2012/0089789 A1 | 4/2012 | Shirlen et al. |
| 2012/0137139 A1 | 5/2012 | Kudoh et al. |
| 2012/0163605 A1 | 6/2012 | Sharon et al. |
| 2012/0169375 A1 | 7/2012 | Himpe |
| 2012/0250426 A1 | 10/2012 | Huang |
| 2013/0007399 A1 | 1/2013 | Smith et al. |
| 2013/0031412 A1 | 1/2013 | Iwasaki |
| 2013/0257498 A1 | 10/2013 | Ge et al. |
| 2013/0290578 A1 | 10/2013 | Chrysos et al. |
| 2014/0040639 A1 | 2/2014 | Raam |
| 2014/0119130 A1 | 5/2014 | Trivedi et al. |
| 2014/0122777 A1 | 5/2014 | Oh et al. |
| 2014/0325134 A1* | 10/2014 | Carpenter .......... G06F 12/1009 711/103 |
| 2014/0365715 A1 | 12/2014 | Lee |
| 2015/0016046 A1* | 1/2015 | Shaeffer ............ G06F 13/385 361/679.32 |
| 2015/0149735 A1 | 5/2015 | Nale et al. |
| 2015/0279463 A1 | 10/2015 | Berke |
| 2016/0098195 A1 | 4/2016 | Nale et al. |
| 2016/0098366 A1 | 4/2016 | Nale et al. |
| 2016/0099044 A1 | 4/2016 | Nale et al. |
| 2016/0132269 A1 | 5/2016 | Nale et al. |
| 2016/0147678 A1 | 5/2016 | Nale et al. |
| 2016/0148653 A1 | 5/2016 | Nale et al. |
| 2016/0179604 A1 | 6/2016 | Nale et al. |
| 2016/0179742 A1 | 6/2016 | Nale et al. |
| 2016/0210187 A1 | 7/2016 | Nale et al. |
| 2016/0211973 A1 | 7/2016 | Nale et al. |

FOREIGN PATENT DOCUMENTS

| | | |
|---|---|---|
| CN | 102737718 A | 10/2012 |
| RU | 2369033 C2 | 9/2009 |
| WO | 2012/036905 A1 | 3/2012 |
| WO | 2015-116100 A1 | 8/2015 |
| WO | 2017/146821 A1 | 8/2017 |

OTHER PUBLICATIONS

"DDR4 DRAM" Standard, Sep. 2012, 214 pages, JEDEC Solid State Technology Association, Arlington, VA.

Office Action received for Chinese Patent Application No. 201380073070.3, dated Feb. 3, 2017, 13 pages.

Notice of Allowance received for Korean Patent Application No. 10-2015-7022074, dated Jul. 25, 2016, 4 pages including 2 pages of English translation.

Office Action received for Russian Patent Application No. 2015134146, dated Sep. 28, 2016, 10 pages including 3 pages of English translation.

Kinsley, T., "DDR4 Module Level Trends and Features", JEDEC Global Standards for Microelectronics Industry, Server Memory Forum 2011.

Notice of Allowance for U.S. Appl. No. 14/967,226, dated May 8, 2017.

Office Action received for U.S. Appl. No. 15/058,129, dated May 5, 2017.

Micron Technology Inc., "DDR SDRAM Small-Outline DIMM", 2004, 41 pages.

Office Action received for U.S. Appl. No. 14/967,210, dated Dec. 30, 2016.

Office Action received for U.S. Appl. No. 14/967,226, dated Jan. 6, 2017.

Office Action received for U.S. Appl. No. 14/967,230, dated Feb. 10, 2017.

Office Action received for U.S. Appl. No. 14/995,145, dated Feb. 9, 2017.

Office Action received for U.S. Appl. No. 15/011,383, dated Feb. 9, 2017.

Office Action received for U.S. Appl. No. 15/058,126, dated Apr. 7, 2017.

Office Action received for U.S. Appl. No. 15/080,577, dated Jan. 17, 2017.

Office Action received for U.S. Appl. No. 15/080,580, dated Nov. 21, 2016.

Office Action received for U.S. Appl. No. 15/011,375, dated Feb. 9, 2017.

Wikipedia, "Scrambler", [online], Last Modified Aug. 19, 2017, [Sep. 11, 2017], retrieved from the Internet at <URL: http://en.wikipedia.org/wiki/Scrambler>.

Office Action received for U.S. Appl. No. 15/058,126, dated Oct. 31, 2016.

European Search Report received for European Patent Application No. 13877923.6, dated Sep. 30, 2016, 14 pages.

Office Action received for U.S. Appl. No. 14/967,210, dated Jul. 8, 2016.

Office Action received for U.S. Appl. No. 14/967,226, dated Jul. 8, 2016.

Office Action received for U.S. Appl. No. 14/967,230, dated Aug. 26, 2016.

Office Action received for U.S. Appl. No. 14/995,145, dated Oct. 3, 2016.

Office Action received for U.S. Appl. No. 15/011,383, dated Sep. 8, 2016.

Office Action received for U.S. Appl. No. 15/011,375, dated Sep. 7, 2016.

(56) References Cited

OTHER PUBLICATIONS

Wikipedia, "Advanced Configuration and Power Interface", [online], Last Modified Jul. 24, 2017, [Retrieved on Sep. 11, 2017], retrieved from the Internet at <URL: http://en.wikipedia.org/wiki/Advanced_Configuration_and_Power_Interface>.

Super Talent Electronics, Inc., "DDR SDRAM DIMM", Product Specification, Revision DFC 10/04 version: B, 2004.

International Preliminary Report on Patentability received for International Application No. PCT/US2013/032633, dated Sep. 24, 2015, 13 pages.

JEDEC Solid State Technology Association "Low Power Double Data Rate (LPDDR) SDRM Standard", JESD209B, JEDEC Standard, Feb. 2010, 76 pages.

Lee, S., "Introduction to LPDDR3", LPDDR3 Symposium 2012, 22 pages.

International Search Report and Written Opinion received for International Application No. PCT/US2013/032633, dated Dec. 30, 2013.

Elpida Memory, Inc., "How to Use DDR SDRAM", Users Manual, Ver. 3.0, Apr. 2002.

Intel Corporation, "Intel Extreme Memory Profile (Intel XMP) DDR3 Technology", White Paper, Jan. 2009.

JEDEC Solid State Technology Association, "DDR3 SDRAM Standard", JEDECc Standard No. 79-3F, Jul. 2012.

JEDEC Solid State Technology Association, "DDR3 SDRAM Standard", JEDEC Standard No. 79-4, Sep. 2012.

Samsung Electronics, "DDR3 SDRAM Specification", Device Operation & Timing Diagram, Rev. 1.4, Nov. 2011.

International Preliminary Report on Patentability received for International Application No. PCT/US2017/012216 dated Sep. 7, 2018, 9 pages.

\* cited by examiner

SUPPORTING MULTIPLE MEMORY TYPES IN A MEMORY SLOT

FIELD

The present disclosure generally relates to the field of electronics. More particularly, some embodiments generally relate to supporting both DDR (Double Data Rate) and NVM (Non-Volatile Memory) DIMM (Dual Inline Memory Module) on the same memory slot.

BACKGROUND

Generally, memory used to store data in a computing system can be volatile (to store volatile information) or non-volatile (to store persistent information). Volatile data structures stored in volatile memory are generally used for temporary or intermediate information that is required to support the functionality of a program during the run-time of the program. On the other hand, persistent data structures stored in non-volatile (or persistent memory) are available beyond the run-time of a program and can be reused.

As computing capabilities are enhanced in processors, one concern is the speed at which memory may be accessed by a processor. For example, to process data, a processor may need to first fetch data from a memory. After completion of the data processing, the results may need to be stored in the memory. Therefore, the memory access speed can have a direct effect on overall system performance.

Another important consideration is power consumption. For example, in mobile computing devices that rely on battery power, it is very important to reduce power consumption to allow for the device to operate while mobile. Power consumption is also important for non-mobile computing devices (such as computer servers, e.g., used in a data center, etc.) as excess power consumption may increase costs (e.g., due to additional power usage, increased cooling requirements, etc.), shorten component life, or limit locations at which a device may be used.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, firmware, or some combination thereof.

Figure 2A:
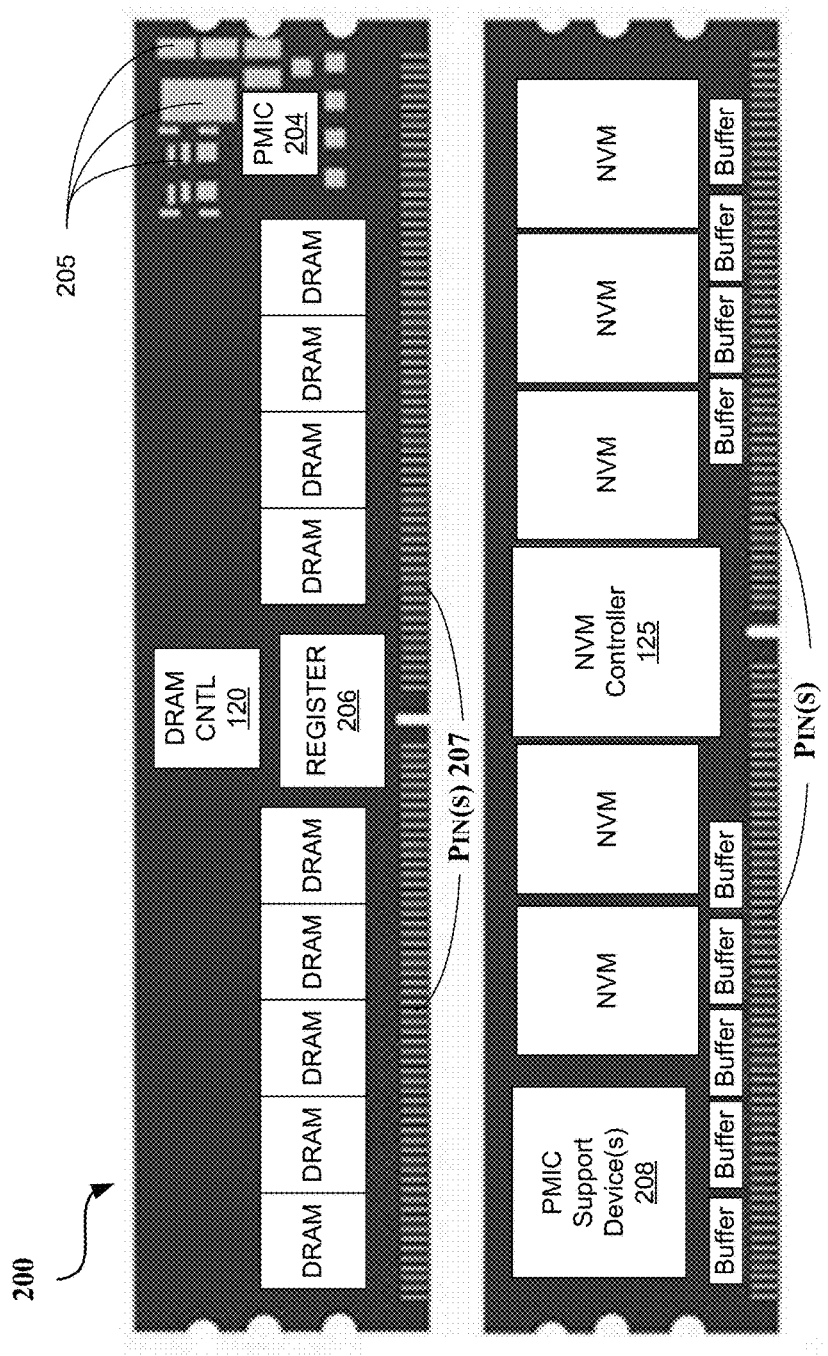
FIG. 2A illustrates a block diagram of a hybrid DIMM, according to an embodiment.

Some embodiments relate to supporting both DDR (or DDR4) and NVM DIMM on the same memory slot. In an embodiment, both volatile and Non-Volatile (NV) memory are provided in a single form factor (e.g., on a single DIMM such as shown in FIG. 2A). The combination of two types of memory on a single printed circuit board or DIMM may be generally referred to herein as "hybrid" DIMM. The integration of non-volatile memory and volatile memory on a single DIMM board may be made compatible with a standard DDR DIMM (or other DDR versions such as DDR3, DDR4, DDR5, LPDDR (Low Power DDR), GDDR (Graphics DDR), etc.) connector in various embodiments as will be further discussed herein. In an embodiment, each of the volatile memory and the non-volatile memory portions of the hybrid memory are addressable through a separate address space by use of chip select signals.

Furthermore, even though some embodiments are generally discussed with reference to Non-Volatile Memory (NVM), embodiments are not limited to a single type of NVM and non-volatile memory of any type or combinations of different NVM types (e.g., including NAND and/or NOR type of memory cells) or other formats usable for memory) may be used. The memory media (whether used in DIMM format or otherwise) can be any type of memory media including, for example, one or more of: nanowire memory, Ferro-electric Transistor Random Access Memory (Fe-TRAM), Magnetoresistive Random Access Memory (MRAM), multi-threshold level NAND flash memory, NOR flash memory, Spin Torque Transfer Random Access Memory (STTRAM), Resistive Random Access Memory, byte addressable 3-Dimensional Cross Point Memory, single or multi-level PCM (Phase Change Memory), memory devices that use chalcogenide phase change material (e.g., chalcogenide glass). Also, any type of Random Access Memory (RAM) such as Dynamic RAM (DRAM), backed by a power reserve (such as a battery or capacitance) to retain the data, may provide an NV memory solution. Volatile memory can include synchronous DRAM (SDRAM). Hence, even volatile memory capable of retaining data during power failure or power disruption(s) may be used for memory in various embodiments.

Figure 1:
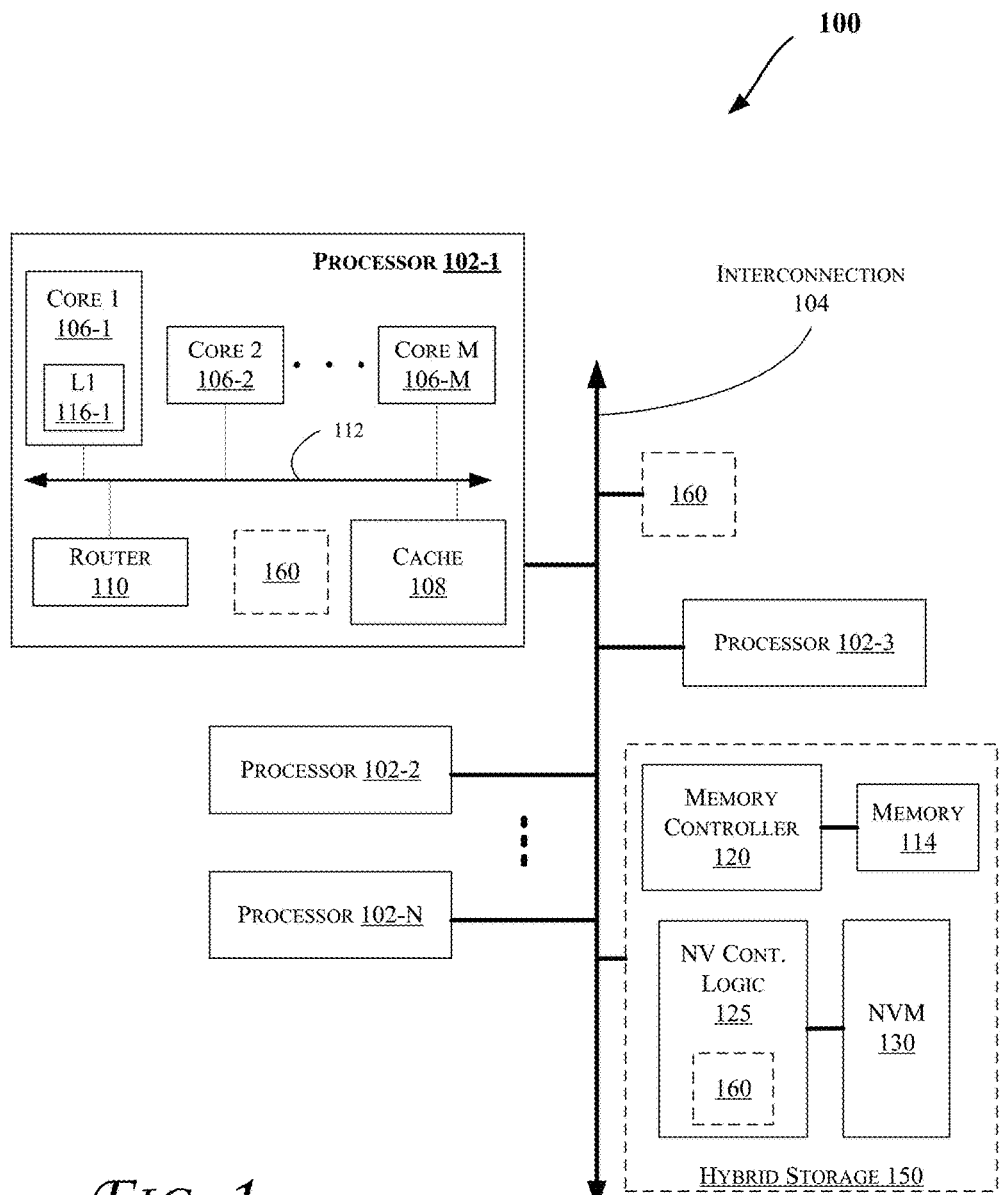
FIGS. 1 and 3-5 illustrate block diagrams of embodiments of computing systems, which may be utilized to implement various embodiments discussed herein.

The techniques discussed herein may be provided in various computing systems (e.g., including a non-mobile computing device such as a desktop, workstation, server, rack system, etc. and a mobile computing device such as a smartphone, tablet, UMPC (Ultra-Mobile Personal Computer), laptop computer, Ultrabook™ computing device, smart watch, smart glasses, smart bracelet, etc.), including those discussed with reference to FIGS. 1-5. More particularly, FIG. 1 illustrates a block diagram of a computing system 100, according to an embodiment. The system 100 may include one or more processors 102-1 through 102-N (generally referred to herein as "processors 102" or "processor 102"). The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a processor cache 108 (which may be a shared cache or a private cache in various embodiments), and/or a router 110. The processor cores 106 may be implemented on a single integrated circuit (IC) chip. Moreover, the chip may include one or more shared and/or private caches (such as processor cache 108), buses or interconnections (such as a bus or interconnection 112), logic 120, memory controllers (such as those discussed with reference to FIGS. 3-5), or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The processor cache 108 may store data (e.g., including instructions) that are utilized by one or more components of the processor 102-1, such as the cores 106. For example, the processor cache 108 may locally cache data stored in a memory 114 for faster access by the components of the processor 102. As shown in FIG. 1, the memory 114 may be in communication with the processors 102 via the interconnection 104. In an embodiment, the processor cache 108 (that may be shared) may have various levels, for example, the processor cache 108 may be a mid-level cache and/or a last-level cache (LLC). Also, each of the cores 106 may include a level 1 (L1) processor cache (116-1) (generally referred to herein as "L1 processor cache 116"). Various components of the processor 102-1 may communicate with the processor cache 108 directly, through a bus (e.g., the bus 112), and/or a memory controller or hub.

As shown in FIG. 1, memory 114 may be coupled to other components of system 100 through a memory controller 120. Memory 114 includes volatile memory and may be interchangeably referred to as main memory. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments.

System 100 also includes NV memory 130 (or Non-Volatile Memory (NVM), e.g., compliant with NVMe (NVM express)) coupled to the interconnect 104 via NV controller logic 125. Hence, logic 125 may control access by various components of system 100 to the NVM 130. Furthermore, even though logic 125 is shown to be directly coupled to the interconnection 104 in FIG. 1, logic 125 may communicate via a storage bus/interconnect (such as the SATA (Serial Advanced Technology Attachment) bus, Peripheral Component Interconnect (PCI) (or PCI express (PCIe) interface), etc.) with one or more other components of system 100 (for example where the storage bus is coupled to interconnect 104 via some other logic like a bus bridge, chipset (such as discussed with reference to FIGS. 3, 4, and/or 5), etc.). Additionally, logic 125 may be incorporated into memory controller logic (such as those discussed with reference to FIGS. 3-5) or provided on a same Integrated Circuit (IC) device in various embodiments (e.g., on the same IC device as the NVM 130 or in the same enclosure as the NVM 130). System 100 may also include other types of non-volatile memory such as those discussed with reference to FIGS. 3-5, including for example a hard drive, etc.

As mentioned above, in one embodiment, a "hybrid" memory product 150 (also referred to herein interchangeably as "hybrid" DIMM, "hybrid" memory, or "hybrid" memory) includes both non-volatile (e.g., NVM 130) and volatile memory (e.g., memory 114), and optionally related components and/or logic (such as portions of logic 120 and/or logic 125). The hybrid memory 150 communicates data to a processor core (e.g., one of the cores 106). In one embodiment, the hybrid DIMM may provide a higher capacity than a DRAM (Dynamic Random Access Memory) only product, while also providing faster access time than al NAND-based NVM only product. Furthermore, system 100 may include more memory than just the hybrid memory 150, such as one or more additional NVM 130 and/or one or more additional memory 114, as well as their associated logic (e.g., logic 120 and/or logic 125).

In some embodiments, a hybrid memory (e.g., memory 150) can operate in accordance with three different modes of operation, including: (1) "memory mode" where the hybrid memory operates as a next level memory that uses DRAM or main memory (such as the memory 114 of FIG. 1); (2) "application direct mode" where a specific (e.g., software) application (e.g., with DIMM driver support) provides an extension to main memory (e.g., an extension to the memory 114 of FIG. 1 or other DDR-only DIMM that may be coupled/plugged to the system) controlled by the application; and (3) "memory mode" where the hybrid memory operates as if it is a standard SSD (or other NVM device) with higher bandwidth, higher capacity, and/or faster access time. In some embodiments, logic (e.g., one or more of the cores 106, logic 160, memory controller 120, NV controller logic 125, BIOS (Basic Input Output System), or firmware) determines whether the DIMM is to be used as memory or persistent memory, or in memory mode. Also, any combination of the three different modes discussed above may be used. In an embodiment, BIOS and/or firmware (e.g., present on the DIMM) may program the hybrid memory for operation in accordance with one or more target modes.

Moreover, as the data set becomes larger and/or the number of threads performed by the processor increases over time, demand for larger memory capacity that is closer to the processor increases. When the processor cannot find data from the main memory or cannot allocate enough space in the main memory, it resorts to the secondary storage such as SSD or HDD, which have a much longer latency than DIMMs. This can impact the overall performance significantly. To this end, the hybrid memory embodiments discussed herein can make a much larger memory capacity available nearer to the processor with the DIMM form factor as well as cache line access, as opposed to block access only used for SSDs.

Furthermore, an Operating System (OS), e.g., executed by a processor or some other computational logic (e.g., processor 102, core 106, etc.), may determine how to utilize the two address spaces associated with the NVM portion and the volatile memory portions of the hybrid memory. For example, the memory mode may respond to the processor and copying the data to NVM (or storing the data to the NVM to reflect data from any other DDR/volatile memory or DIMM); memory mode may result in NV portion being used as a block memory device while the DRAM portion is saved as main memory; or, the application direct mode is used to provide disjointed address space for some logic (e.g., OS, processor, driver, etc.).

Moreover, in server platforms, a DDR DIMM can be an essential unit for data communication to a processor core with higher bandwidth. One implementation may use one individual non-volatile memory device and one separate/individual volatile memory device where these two distinct memory devices use two or more sockets. In higher density systems or smaller form factor systems, there often is not enough DIMM/memory sockets to install an NVDIMM alongside with a DDR DIMM. If the user has to replace one of DDR DIMMs with an NVDIMM, the system often suffers for a lack of bandwidth. For such system, which takes up higher volume than the high-end server platform in the market, to provide the benefit of capacity and different mode of NVDIMM without sacrificing too much of high bandwidth DRAM DIMM, there is a need for innovative solutions to increase bandwidth, reduce power, and/or increase capacity of the single DIMM.

To this end, some embodiments provide higher bandwidth and/or higher capacity by combining both DDR/DDR4 DIMM and NVDIMM on a single DIMM module. In various embodiments, more than one volatile memory devices (e.g., DDR/DDR4 memory) and/or more than one NV memory devices can be combined on one DIMM form factor. An embodiment also integrates related memory controller for both memory devices on the same DIMM device. Such approaches make both memory technologies available through a single DDR/DIMM socket/slot and achieve minimized space usage as well as faster communication. Also, some embodiments may achieve these goals without changing the platform design and instead acts as if two logical DIMMs are provided through a single physical socket/slot. For example, one embodiment provides a path for separate DIMM control (e.g., via SMBus (System Management Bus) such as one or more of the interconnect(s)/bus(es) discussed with reference to FIGS. 1, 3, 4, and/or 5), as well as DDR/DDR4 and NVDIMM interface(s). Power distribution may also be made more uniform (e.g., since at least two of the power pins of the DIMM interface may be shared for both types of memory, for example to allow usage of the same DIMM slot), while supporting higher bandwidth at platform level.

In an embodiment, the hybrid DIMM (also sometimes referred to herein as integrated DIMM) is plugged into one standard DDR/DDR4 socket/slot without platform modification to communicate data to processor core. With a few re-purposed pin usage (such as those discussed below), both sides (NV memory and volatile memory) can operate as if they are independent DIMMs with their own socket/slot and address their potentially different thermal limitations. Hence, through optimized placement and efficient thermal design (e.g., as discussed with reference to FIG. 2A), all components with different temperature limits can be operated within a reliable range.

As mentioned above, the hybrid DIMM would only need one DDR/DDR4 connector in one server board to provide both types of memory technology rather than at least two DDR/DDR4 connectors. This in turn allows for reduced board space requirements for DIMMs and allows for the feasibility of smaller system form factor. Further, some Type1 NVDIMMs may include both a certain capacity of DDR/DDR4 in conjunction with matching NVM on the same DIMM. Physically this may look similar but targets a different goal. More particularly, the NVM portion of Type 1 NVDIMM is not visible/addressable to the system as discussed herein (e.g., as an extension of memory) nor an independent SSD device; rather, it is instead hidden as a fail-safe memory for DDR/DDR4 portion of the DIMM.

Even with recent efforts to define extensions of NVDIMM model, none can provide NVDIMM capability of a memory mode as well as memory mode from the same DIMM, while still providing DDR/DDR4 bandwidth for processor as discussed herein.

Furthermore, the hybrid DIMM may provide thermal and/or power management solutions via logic 160, e.g., embedded in the on-board NVDIMM controller (or other locations such as shown in FIGS. 1 and 3-5 or other locations). For example, logic 160 may compare power dissipation, thermal behavior, and/or other operational parameters (such as current draw, voltage draw, etc.) of the two types of memory on the same DIMM and cause modification to the operational characteristics (e.g., frequency, current, voltage, etc.) of one or both of the memory types to effect a change in the overall thermal or power behavior of the hybrid DIMM. In an embodiment, logic 160 may make the comparison (or the modification) based on information detected/received from one or more sensors (such as those discussed with reference to FIG. 2B) which are (e.g., thermally, electrically, etc.) proximate to the memory devices to detect variations in temperature, power consumption, power dissipation, current draw, voltage draw, and so forth.

For instance, logic 160 may balance the relatively higher power dissipation from the non-volatile memory portion of the hybrid DIMM with the relatively lower power dissipation by volatile memory portion of the hybrid DIMM, and manage the overall thermal/performance behavior of the hybrid DIMM. This in turn allows for a more uniform, optimized platform level power distribution on a hybrid DIMM and also allow for better performance for hybrid DIMM within the same space, volume, environment, and/or temperature limit requirements than purely non-volatile memory products in DIMM factor. Moreover, as shown in FIG. 1, logic 120 and/or 125 may share the same physical interface to the processors 102, e.g., allowing a single physical slot to be used for two logical interfaces. Also, one or more separate socket(s) or slot(s) may be used for other types of memory such as another memory 114, another NVM 130, another DIMM/DDR, etc. (not shown) in system 100.

Furthermore, on-DIMM power delivery and management logic (e.g., logic 160) may provide protection from main power (power from DIMM connector) failure, which allows the controller logic to save all committed data on DIMM interface to NVM in case of power failure. Generally, anything committed on the DIMM interface are considered 'gone or stored' from the processor's perspective, and this power failure protection feature is important for many (e.g., computing system or server) applications where data integrity is to be maintained, even after occurrence of power failure.

FIG. 2A illustrates a block diagram of a hybrid DIMM 200, according to an embodiment. More particularly, FIG. 2A shows an example for component placement on two sides of a hybrid DIMM (such as hybrid memory 150 of FIG. 1), e.g., where non-volatile and volatile memory devices and related components are provided in one standard DIMM form factor. In one standard DDR/DDR4 DIMM sized PCB (Printed Circuit Board), non-volatile memory devices (labeled as NVM in FIG. 2A, e.g., forming NVM 130), controller logic 125 and data buffer(s) (for buffering data to be stored in or read from the NVM blocks) sit on one side of the DIMM (i.e., bottom portion of FIG. 2A). Volatile memory devices (labeled as DRAM in FIG. 2A, such as memory 114 of FIG. 1), a register 206 (to store information for addressing memory cells in the DRAM blocks), volatile memory controller logic (e.g., logic 120), and Power Management Integrated Circuit (PMIC) 204, e.g., with voltage supply rails 205 sitting on the other side of the DIMM (i.e., top portion of FIG. 2A). In an embodiment, register 206 and logic 120 are combined to receive command(s) from the processor and transmit signal(s) to volatile memory device(s). As shown in FIG. 2A, the NV side of the DIMM may also optionally include one or more devices 208 to support PMIC's functionality, such as one or more sensors discussed above or other logic and/or other logic to support power failure protection as discussed herein. Also, while FIG. 2A discusses having one side of a DIMM dedicated to non-volatile memory and the other side to volatile memory, embodiments are not limited to this approach and portions of volatile and NV memory and/or their associated logic may be spread amongst different sides of the same DIMM.

In some embodiments, the components shown in FIG. 2A are coupled by internal traces in different layers of the PCB based on the design guide. The DIMM may be plugged into one standard DDR/DDR4 connector to communicate with processor core(s) (e.g., core 106 of FIG. 1). Additionally, the component placement may vary to achieve thermal optimization for different power, environment, reliability, etc. conditions.

A DIMM can include multiple pins defined by a standard such as DDR4 (promulgated by the JEDEC® (Joint Electron Device Engineering Council, now the JEDEC Solid State Technology Association), including for example DDR4 SDRAM Standard, Rev. A, document JESD79-4A, November 2013). In an embodiment, one or more pins (e.g., not being used for control of a volatile memory such as any one of the pins 207 of FIG. 2A) can be repurposed for use for control of a non-volatile memory or vice versa. Accordingly, uses of the volatile and non-volatile memory on a single DIMM can occur simultaneously by using unused pins. A memory controller can send a command to a volatile or non-volatile memory at a time because the data bus may be shared by volatile and non-volatile memories. However, a command from a memory controller need not be completed (e.g., data provided or written) prior to the memory controller sending another command.

For example, configuration or control pins (e.g., one or more of: Ax (address pin), Cx (chip select pins), GNT (grant pin to indicate status of a grant request), etc.) from memory controller to be used for two DDR/DDR4 CS# (Chip Select) (e.g., dual-rank DDR/DDR4) (or other number of ranks including a single rank, multiple ranks, etc.), for ODT (on-die termination), and/or CKE (clock enable) from memory controller to be used for DDR/DDR4. Each of the two chip select (e.g., C1 and C2) pins may be used to address different ranks (e.g., 2 ranks, namely ranks 1 and 0) configured on a hybrid memory device, such as to select a volatile or non-volatile memory for use. As an example, C2 may be used for CS1# of DDR4, C1 for CS0# for DDR in dual rank DDR (or in case of a single rank device, C2 or CS1# are not needed). In one example, address pin A17 may go to CKE for DDR, GNT (which may be referred to S1# in some implementations) for ODT of DDR. Also, some server memory controller may include signal multiplexing capability to support both DDR/DDR4 and NVDIMM for different configurations. Hence, a minor extension may be made to the multiplexing at the end of memory controller addressing path in such implementations. Moreover, the minor extension can be made to the processor memory controller to include the capability to support pin repurposing itself. For example, the processor memory controller may need to know whether it is hybrid DIMM or conventional DDR DIMM and feed the signal(s) to the repurposed pins accordingly.

For example, pins A17, C2, C1, and GNT# coupled to a memory controller can be used for two DDR4 CS#, ODT, and CKE for DDR4. A17 would be repurposed to CKE to volatile side and GNT# could be repurposed to ODT to volatile side. Furthermore, if pin mapping (or repurposing) is implemented in such a way that A17 corresponds to CS1# of DDR, C2 corresponds to CS0# of DDR, and GNT corresponds to CKE for DDR (which could also be S1# pin of DDR4 DIMM in some embodiments), then C1 can be ODT for DDR. In an embodiment, at boot-up, BIOS (Basic Input Output System) is aware of the specific type of DIMM available on each memory channel (e.g., based on some stored information such as data stored in a non-volatile memory device including those discussed herein, for example, with reference to FIGS. 3, 4, and/or 5). Based on such information, BIOS may generate a memory map and configure the memory controller (e.g., memory controller 120 and/or NV controller logic 125) according to the memory map.

When the memory controller detects an address that belong to VM side of this hybrid (namely, for the memory controller only the address range may be used for this purpose in some embodiments), it asserts A17 or C2 depending on which rank it accesses (e.g., without using a command in at least one embodiment). The rank to be accessed may also be determined by the address range as a different rank would represent a different address in the memory map mentioned above. Additionally, once the memory controller detects an address corresponding to NVM portion, it uses a protocol (such as an NVDIMM protocol) and sends a command using one or more signals (e.g., defined for an NVDIMM protocol). Accordingly, no A17 or C2 pins are asserted in this case so that the DDR4 portion avoids responding to the address/data driven on DIMM interface. Moreover, the SMBus may be independent from DDR or NVDIMM; hence, there would be no physical connections between them, rather SMBus may be supported for both portions of the hybrid memory. For example, the hybrid memory may appear as two logical DIMMs from a software management perspective. In an embodiment, the platform hardware assume a single SMBus slave per physical DIMM to limit re-design of the platform hardware.

In some embodiments, the memory devices discussed herein (such as the hybrid memory device or at least a non-volatile portion thereof) may be controlled or implemented in accordance with the techniques discussed in United States Published Patent Application Number 20150149735, having U.S. Ser. No. 13/997,653, entitled "Memory System," filed Jun. 28, 2013, and/or its parent patent application PCT/US2013/032633 filed under the Patent Cooperation Treaty (PCT) on Mar. 15, 2013, both of which are hereby incorporated herein by reference, in their entirety, and for all purposes.

Figure 2B:
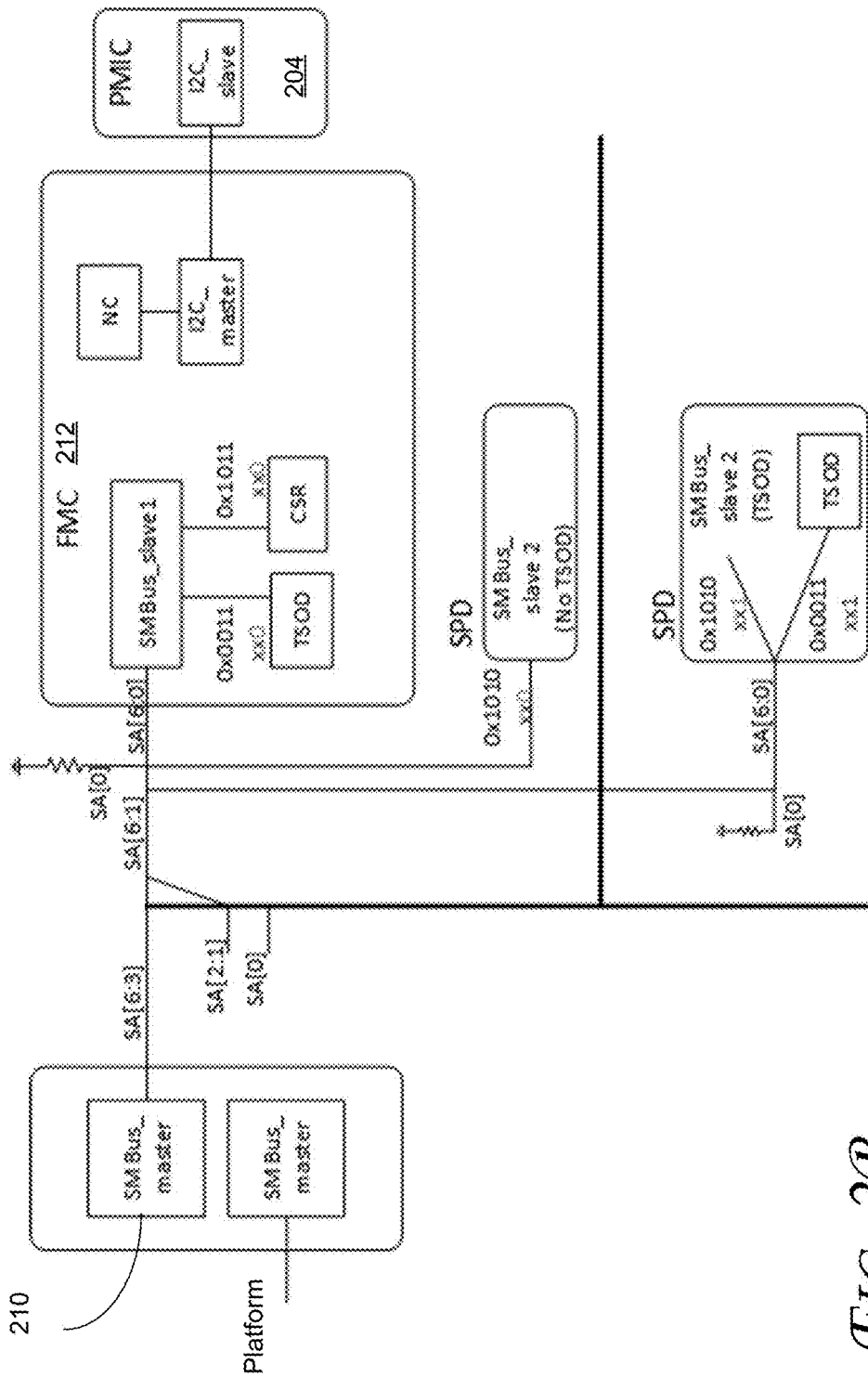
FIG. 2B illustrates a block diagram of logic to allow a hybrid DIMM to address two different memory devices via the same slot.

Moreover, even though some DIMM sockets may only have one SMBus device address allocated for communication with the platform (e.g., processor core 106), the hybrid DIMM may need to be able to fork the SMBus to address two logical DIMMs coupled to the same slot. FIG. 2B shows a scheme to achieve this without redesigning the entire platform. Hence, FIG. 2B shows a block diagram of various components to allow for the usage of the same platform (e.g., designed for non-hybrid DIMMs) to manage the hybrid DIMM implementation without changing the entire platform design. For example, referring to FIG. 2B, to manage a hybrid memory device in an embodiment, an SMBus port to the DIMM is used. It is not for accessing data in NVM or VM. Rather, this port is used for thermal monitoring and initialization of DIMM. More particularly, FIG. 2B shows one way to differentiate the SMBus request destination on DIMM since it has two logically separate DIMMs (which means the platform may see it as two different DIMMs).

As discussed herein, "SA" refers to Slave Address. As shown in FIG. 2B, the hybrid DIMM may assign SA[0] internally (e.g., via its own SMBus master 210), so that it can be seen as two logical DIMMs from DIMM management's point of view; hence, all existing platform infra should work properly with this configuration. More particularly, there are two slaves (labeled slaves 1 and 2 in FIG. 2B, where one slave is an NVM, while the other slave is a VM) which can now be addressed via SA[6:0] (e.g., where the 7-bit addressing is capable of supporting 128 logic DIMMs or 64 hybrid DIMMs, although embodiments are not limited to 7 bits and more or less bits may be used depending on the implementation such as 3 bits, etc.) by using the internal bus master logic 210. For example, a Flash Memory Controller (FMC) 212 may be addressed via SA[6:0] as shown. FIG. 2B also shows that I2C (Interface to Communicate) mater/slave interfaces may be used to communicate with various logic on the hybrid DIMM. Also, one or more registers (e.g., Control and Status Register (CSR) to store data) and/or a thermal sensor (e.g., Thermal Sensor On Die (TSOD) to provide a single temperature reading for an entire DIMM), etc. may also be provided in various embodiments.

Figure 2C:
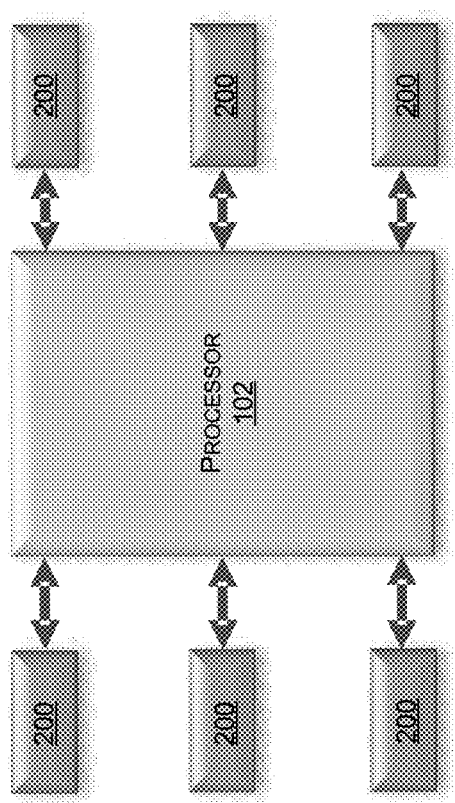
FIG. 2C illustrates a block diagram of a platform memory configuration in accordance with an embodiment.

FIG. 2C shows a block diagram of a platform memory configuration in accordance with an embodiment. As shown, a processor (e.g., processor 102 of FIG. 1) may be coupled to one or more hybrid DIMMs 200, e.g., via a bus or interconnection (such as interconnection 104 of FIG. 1). As discussed herein, the system may include other memory devices in addition to the hybrid memory 150 and/or hybrid DIMMs 200.

Figure 3:
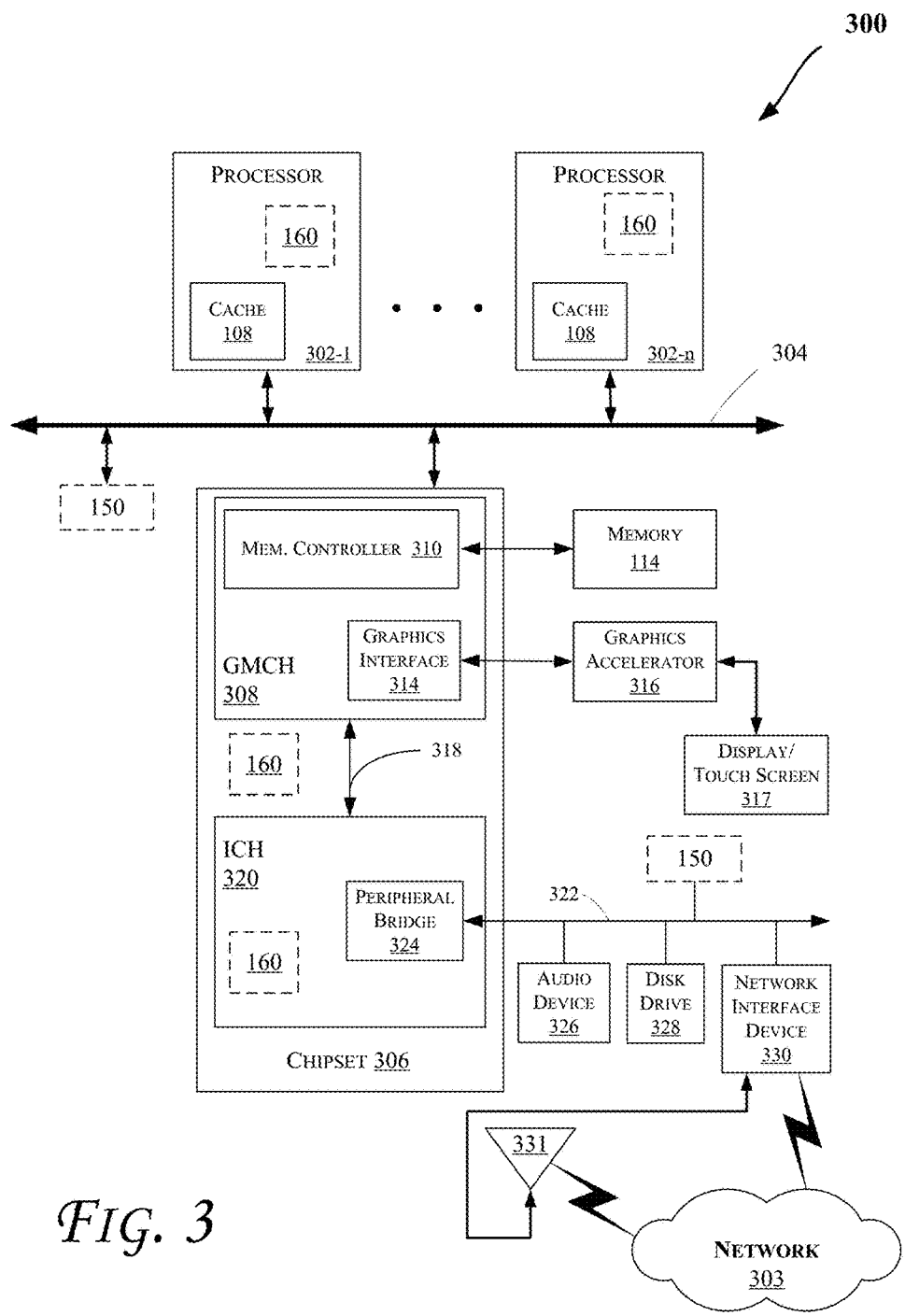

FIG. 3 illustrates a block diagram of a computing system 300 in accordance with an embodiment. The computing system 300 may include one or more central processing unit(s) (CPUs) 302 or processors that communicate via an interconnection network (or bus) 304. The processors 302 may include a general purpose processor, a network processor (that processes data communicated over a computer network 303), an application processor (such as those used in cell phones, smart phones, etc.), or other types of a processor (including a reduced instruction set computer (RISC) processor or a complex instruction set computer (CISC)).

Various types of computer networks 303 may be utilized including wired (e.g., Ethernet, Gigabit, Fiber, etc.) or wireless networks (such as cellular, including 3G (Third-Generation Cell-Phone Technology or 3rd Generation Wireless Format (UWCC)), 4G (Fourth-Generation Cell-Phone Technology), 4G Advanced, Low Power Embedded (LPE), Long Term Evolution (LTE), LTE advanced, etc.). Moreover, the processors 302 may have a single or multiple core design. The processors 302 with a multiple core design may integrate different types of processor cores on the same integrated circuit (IC) die. Also, the processors 302 with a multiple core design may be implemented as symmetrical or asymmetrical multiprocessors.

In an embodiment, one or more of the processors 302 may be the same or similar to the processors 102 of FIG. 1. For example, one or more of the processors 302 may include one or more of the cores 106 and/or processor cache 108. Also, the operations discussed with reference to FIGS. 1-2C may be performed by one or more components of the system 300.

A chipset 306 may also communicate with the interconnection network 304. The chipset 306 may include a graphics and memory control hub (GMCH) 308. The GMCH 308 may include a memory controller 310 (which may be the same or similar to the memory controller 120 of FIG. 1 in an embodiment) that communicates with the memory 114. The memory 114 may store data, including sequences of instructions that are executed by the CPU 302, or any other device included in the computing system 300. Also, system 300 includes logic 160 and/or hybrid memory 150 in various locations such as shown or not shown. In one embodiment, the memory 114 may include one or more volatile memory devices such as random access memory (RAM), dynamic RAM (DRAM), synchronous DRAM (SDRAM), static RAM (SRAM), or other types of memory devices. Non-volatile memory may also be utilized such as a hard disk drive, flash, etc., including any NVM discussed herein. Additional devices may communicate via the interconnection network 304, such as multiple CPUs and/or multiple system memories.

The GMCH 308 may also include a graphics interface 314 that communicates with a graphics accelerator 316. In one embodiment, the graphics interface 314 may communicate with the graphics accelerator 316 via an accelerated graphics port (AGP) or Peripheral Component Interconnect (PCI) (or PCI express (PCIe) interface). In an embodiment, a display 317 (such as a flat panel display, touch screen, etc.) may communicate with the graphics interface 314 through, for example, a signal converter that translates a digital representation of an image stored in a memory device such as video memory or system memory into display signals that are interpreted and displayed by the display. The display signals produced by the display device may pass through various control devices before being interpreted by and subsequently displayed on the display 317.

A hub interface 318 may allow the GMCH 308 and an input/output control hub (ICH) 320 to communicate. The ICH 320 may provide an interface to I/O devices that communicate with the computing system 300. The ICH 320 may communicate with a bus 322 through a peripheral bridge (or controller) 324, such as a peripheral component interconnect (PCI) bridge, a universal serial bus (USB) controller, or other types of peripheral bridges or controllers. The bridge 324 may provide a data path between the CPU 302 and peripheral devices. Other types of topologies may be utilized. Also, multiple buses may communicate with the ICH 320, e.g., through multiple bridges or controllers. Moreover, other peripherals in communication with the ICH 320 may include, in various embodiments, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 322 may communicate with an audio device 326, one or more disk drive(s) 328, and a network interface device 330 (which is in communication with the computer network 303, e.g., via a wired or wireless interface). As shown, the network interface device 330 may be coupled to an antenna 331 to wirelessly (e.g., via an Institute of Electrical and Electronics Engineers (IEEE) 802.11 interface (including IEEE 802.11a/b/g/n/ac, etc.), cellular interface, 3G, 4G, LPE, etc.) communicate with the network 303. Other devices may communicate via the bus 322. Also, various components (such as the network interface device 330) may communicate with the GMCH 308 in some embodiments. In addition, the processor 302 and the GMCH 308 may be combined to form a single chip. Furthermore, the graphics accelerator 316 may be included within the GMCH 308 in other embodiments.

Furthermore, the computing system 300 may include volatile and/or nonvolatile memory. For example, nonvolatile memory may include one or more of the following: read-only memory (ROM), programmable ROM (PROM), erasable PROM (EPROM), electrically EPROM (EEPROM), a disk drive (e.g., 328), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 4:
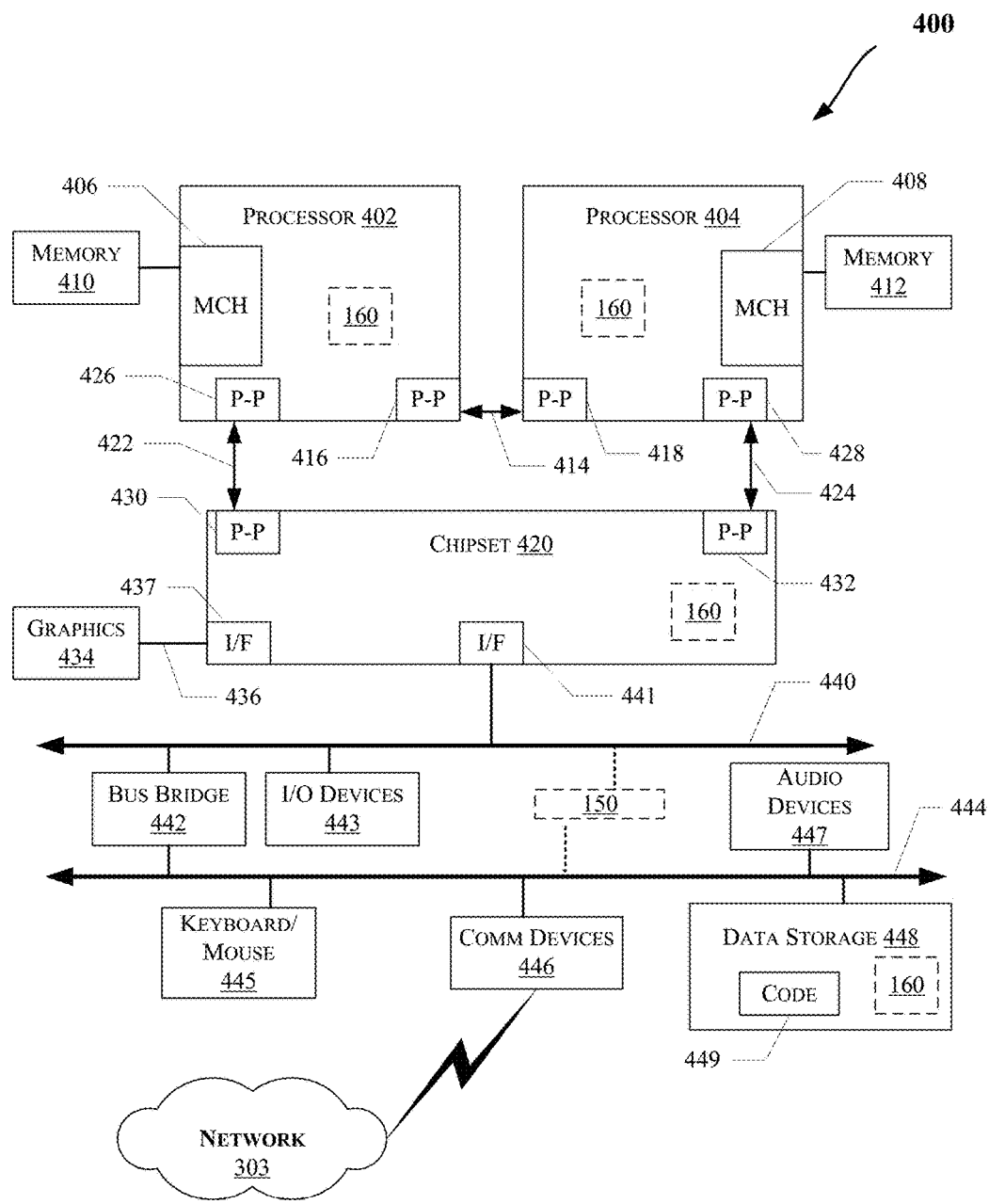

FIG. 4 illustrates a computing system 400 that is arranged in a point-to-point (PtP) configuration, according to an embodiment. In particular, FIG. 4 shows a system where processors, memory, and input/output devices are interconnected by a number of point-to-point interfaces. The operations discussed with reference to FIGS. 1-3 may be performed by one or more components of the system 400.

As illustrated in FIG. 4, the system 400 may include several processors, of which only two, processors 402 and 404 are shown for clarity. The processors 402 and 404 may each include a local memory controller hub (MCH) 406 and 408 to enable communication with memories 410 and 412. The memories 410 and/or 412 may store various data such as those discussed with reference to the memory 114 of FIGS. 1 and/or 3. Also, MCH 406 and 408 may include the memory controller 120 in some embodiments. Furthermore, system 400 includes logic 160 and/or hybrid memory 150 in various locations such as shown or not shown. The logic 160 and/or hybrid memory 150 may be coupled to system 400 via bus 440 or 444, via other point-to-point connections to the processor(s) 402 or 404 or chipset 420, etc. in various embodiments.

In an embodiment, the processors 402 and 404 may be one of the processors 302 discussed with reference to FIG. 3. The processors 402 and 404 may exchange data via a point-to-point (PtP) interface 414 using PtP interface circuits 416 and 418, respectively. Also, the processors 402 and 404 may each exchange data with a chipset 420 via individual PtP interfaces 422 and 424 using point-to-point interface circuits 426, 428, 430, and 432. The chipset 420 may further exchange data with a high-performance graphics circuit 434 via a high-performance graphics interface 436, e.g., using a PtP interface circuit 437. As discussed with reference to FIG. 3, the graphics interface 436 may be coupled to a display device (e.g., display 317) in some embodiments.

In one embodiment, one or more of the cores 106 and/or processor cache 108 of FIG. 1 may be located within the processors 402 and 404 (not shown). Other embodiments, however, may exist in other circuits, logic units, or devices within the system 400 of FIG. 4. Furthermore, other embodiments may be distributed throughout several circuits, logic units, or devices illustrated in FIG. 4.

The chipset 420 may communicate with a bus 440 using a PtP interface circuit 441. The bus 440 may have one or more devices that communicate with it, such as a bus bridge 442 and I/O devices 443. Via a bus 444, the bus bridge 442 may communicate with other devices such as a keyboard/mouse 445, communication devices 446 (such as modems, network interface devices, or other communication devices that may communicate with the computer network 303, as discussed with reference to network interface device 330 for example, including via antenna 331), audio I/O device, and/or a data storage device 448. The data storage device 448 may store code 449 that may be executed by the processors 402 and/or 404.

Figure 5:
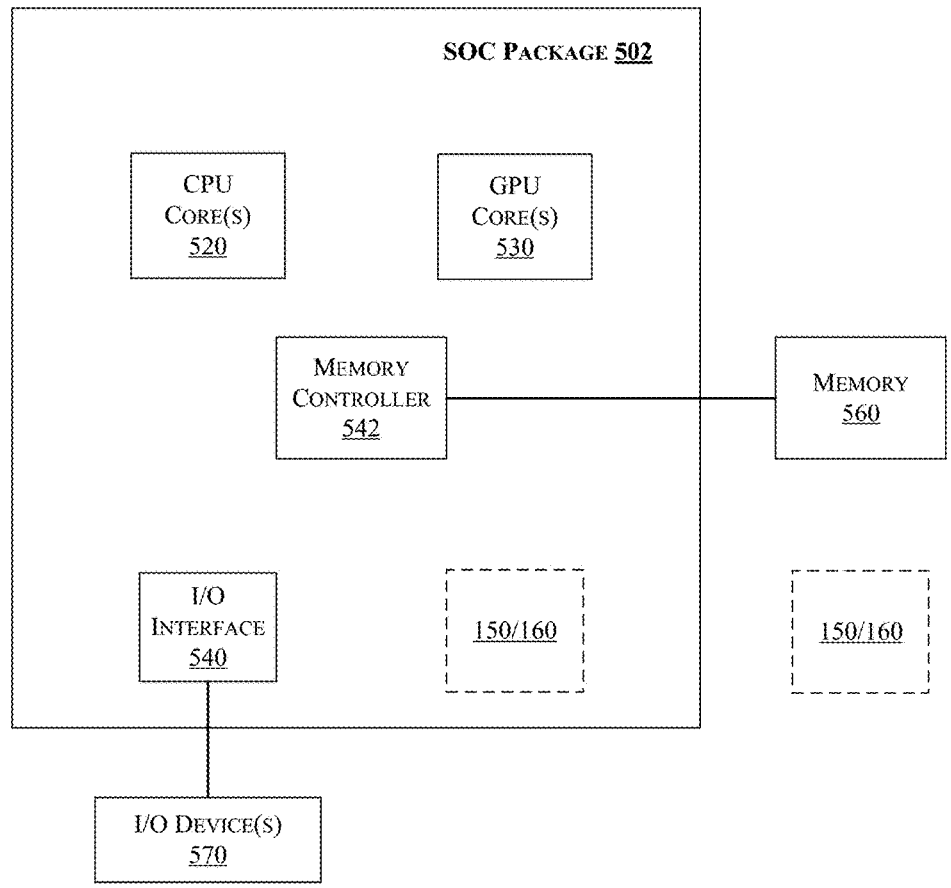

In some embodiments, one or more of the components discussed herein can be embodied as a System On Chip (SOC) device. FIG. 5 illustrates a block diagram of an SOC package in accordance with an embodiment. As illustrated in FIG. 5, SOC 502 includes one or more Central Processing Unit (CPU) cores 520, one or more Graphics Processor Unit (GPU) cores 530, an Input/Output (I/O) interface 540, and a memory controller 542. Various components of the SOC package 502 may be coupled to an interconnect or bus such as discussed herein with reference to the other figures. Also, the SOC package 502 may include more or less components, such as those discussed herein with reference to the other figures. Further, each component of the SOC package 520 may include one or more other components, e.g., as discussed with reference to the other figures herein. In one embodiment, SOC package 502 (and its components) is provided on one or more Integrated Circuit (IC) die, e.g., which are packaged onto a single semiconductor device.

As illustrated in FIG. 5, SOC package 502 is coupled to a memory 560 (which may be similar to or the same as memory discussed herein with reference to the other figures) via the memory controller 542. In an embodiment, the memory 560 (or a portion of it) can be integrated on the SOC package 502.

The I/O interface 540 may be coupled to one or more I/O devices 570, e.g., via an interconnect and/or bus such as discussed herein with reference to other figures. I/O device(s) 570 may include one or more of a keyboard, a mouse, a touchpad, a display, an image/video capture device (such as a camera or camcorder/video recorder), a touch screen, a speaker, or the like. Furthermore, SOC package 502 may include/integrate items 150 and/or 160 in an embodiment. Alternatively, items 150 and/or 160 may be provided outside of the SOC package 502 (i.e., as a discrete logic).

The following examples pertain to further embodiments. Example 1 includes an apparatus comprising: a Dual Inline Memory Module (DIMM) to comprise volatile memory and non-volatile memory, wherein a single memory slot provides data communication with the volatile memory or the non-volatile memory. Example 2 includes the apparatus of example 1, comprising logic to cause modification to an operational characteristic of one of the volatile memory or the non-volatile memory based at least in part on information to be detected at one or more sensors. Example 3 includes the apparatus of example 2, wherein the one or more sensors are to detect variations in one or more of: temperature, power consumption, power dissipation, current draw, or voltage draw. Example 4 includes the apparatus of example 2, wherein the one or more sensors are to comprise at least one Thermal Sensor On Die (TSOD). Example 5 includes the apparatus of example 1, comprising logic to communicate data between a processor, having one or more processor cores, and the DIMM via the single memory slot, wherein the DIMM is to appear to the processor as a single DIMM. Example 6 includes the apparatus of example 1, wherein each of the volatile memory and the non-volatile memory are to be addressable. Example 7 includes the apparatus of example 1, comprising logic to direct data to or from one of the volatile memory or the non-volatile memory. Example 8 includes the apparatus of example 1, wherein the non-volatile memory is to comprise a plurality of non-volatile memory devices. Example 9 includes the apparatus of example 1, wherein the volatile memory is to comprise one or more dynamic random access memory devices. Example 10 includes the apparatus of example 1, wherein the non-volatile memory is to comprise one or more of: nanowire memory, Ferro-electric Transistor Random Access Memory (FeTRAM), Magnetoresistive Random Access Memory (MRAM), flash memory, Spin Torque Transfer Random Access Memory (STTRAM), Resistive Random Access Memory, byte addressable 3-Dimensional Cross Point Memory, PCM (Phase Change Memory), and volatile memory backed by a power reserve to retain data during power failure or power disruption. Example 11 includes the apparatus of example 1, further comprising one or more network interfaces to communicate data with the DIMM or a processor having one or more processor cores.

Example 12 includes a method comprising: communicating data with volatile memory of a DIMM and non-volatile memory of the DIMM via a single memory slot. Example 13 includes the method of example 12, further comprising causing modification to an operational characteristic of one of the volatile memory or the non-volatile memory based at least in part on information to be detected at one or more sensors. Example 14 includes the method of example 13, further comprising the one or more sensors detecting variations in one or more of: temperature, power consumption, power dissipation, current draw, or voltage draw. Example 15 includes the method of example 13, wherein the one or more sensors comprise at least one Thermal Sensor On Die (TSOD). Example 16 includes the method of example 12, further comprising communicating data between a processor, having one or more processor cores, and the DIMM via the single memory slot, wherein the DIMM appears to the processor as a single DIMM. Example 17 includes the method of example 12, further comprising addressing each of the volatile memory and the non-volatile memory. Example 18 includes the method of example 12, further comprising directing data to or from one of the volatile memory or the non-volatile memory. Example 19 includes the method of example 12, wherein the non-volatile memory comprises one or more of: nanowire memory, Ferro-electric Transistor Random Access Memory (FeTRAM), Magnetoresistive Random Access Memory (MRAM), flash memory, Spin Torque Transfer Random Access Memory (STTRAM), Resistive Random Access Memory, byte addressable 3-Dimensional Cross Point Memory, PCM (Phase Change Memory), and volatile memory backed by a power reserve to retain data during power failure or power disruption. Example 20 includes the method of example 12, further comprising communicating data between one or more network interfaces and the DIMM.

Example 21 includes a computer system comprising: a display device; a Dual Inline Memory Module (DIMM), coupled to the display device, the DIMM to comprise volatile memory and non-volatile memory, wherein data is to be communicated with the volatile memory and the non-volatile memory via a single memory slot. Example 22 includes the computer system of example 21, comprising logic to cause modification to an operational characteristic of one of the volatile memory or the non-volatile memory based at least in part on information to be detected at one or more sensors. Example 23 includes the computer system of example 21, comprising logic to communicate data between a processor, having one or more processor cores, and the DIMM via the single memory slot, wherein the DIMM is to appear to the processor as a single DIMM. Example 24 includes the computer system of example 21, wherein each of the volatile memory and the non-volatile memory are to be addressable. Example 25 includes the computer system of example 21, comprising logic to direct data to or from one of the volatile memory or the non-volatile memory. Example 26 includes the computer system of example 21, comprising one or more of: at least one processor communicatively coupled to the DIMM, a battery communicatively coupled to the computer system, or a network interface communicatively coupled to the computer system.

Example 27 includes an apparatus comprising means to perform a method as set forth in any preceding example. Example 28 comprises machine-readable storage including machine-readable instructions, when executed, to implement a method or realize an apparatus as set forth in any preceding example.

In various embodiments, the operations discussed herein, e.g., with reference to FIGS. 1-5, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a memory device such as those discussed with respect to FIGS. 1-5.

Additionally, such tangible computer-readable media may be downloaded as a computer program product, wherein the program may be transferred from a remote computer (e.g., a server) to a requesting computer (e.g., a client) by way of data signals (such as in a carrier wave or other propagation medium) via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features, numerical values, and/or methodological acts, it is to be understood that claimed subject matter may not be limited to the specific features, numerical values, or acts described. Rather, the specific features, numerical values, and acts are disclosed as sample forms of implementing the claimed subject matter.

The invention claimed is:

1. An apparatus comprising:
a Dual Inline Memory Module (DIMM) to comprise volatile memory and non-volatile memory,
wherein a single memory slot provides data communication with the volatile memory or the non-volatile memory based at least in part on a chip select signal, wherein the chip select signal is to indicate whether a memory access from a processor is to be directed at the volatile memory or the non-volatile memory, wherein a Basic Input Output System (BIOS) is to configure a memory controller at boot time based on memory map information, wherein the BIOS is to generate the memory map information based on data stored in the volatile memory.

2. The apparatus of claim 1, comprising logic to cause modification to an operational characteristic of one of the volatile memory or the non-volatile memory based at least in part on information to be detected at one or more sensors.

3. The apparatus of claim 2, wherein the one or more sensors are to detect variations in one or more of: temperature, power consumption, power dissipation, current draw, or voltage draw.

4. The apparatus of claim 2, wherein the one or more sensors are to comprise at least one Thermal Sensor On Die (TSOD).

5. The apparatus of claim 1, comprising logic to communicate data between the processor, having one or more processor cores, and the DIMM via the single memory slot, wherein the DIMM is to appear to the processor as a single DIMM.

6. The apparatus of claim 1, wherein each of the volatile memory and the non-volatile memory are to be addressable.

7. The apparatus of claim 1, comprising logic to direct data to or from one of the volatile memory or the non-volatile memory.

8. The apparatus of claim 1, wherein the non-volatile memory is to comprise a plurality of non-volatile memory devices.

9. The apparatus of claim 1, wherein the volatile memory is to comprise one or more dynamic random access memory devices.

10. The apparatus of claim 1, wherein the non-volatile memory is to comprise one or more of: nanowire memory, Ferro-electric Transistor Random Access Memory (Fe-TRAM), Magnetoresistive Random Access Memory (MRAM), Spin Torque Transfer Random Access Memory (STTRAM), Resistive Random Access Memory, byte addressable 3-Dimensional Cross Point Memory, PCM (Phase Change Memory), and volatile memory backed by a power reserve to retain data during power failure or power disruption.

11. The apparatus of claim 1, further comprising one or more network interfaces to communicate data with the DIMM or the processor having one or more processor cores.

12. The apparatus of claim 1, comprising logic to cause modification to an operational characteristic of one of the volatile memory or the non-volatile memory based at least in part on information to be detected at one or more sensors, wherein the one or more sensors are to detect variations in power dissipation.

13. The apparatus of claim 1, wherein the non-volatile memory is to comprise flash memory.

14. The apparatus of claim 1, wherein the memory controller is capable to control access to both volatile memory or the non-volatile memory.

15. A method comprising:
communicating data with volatile memory of a Dual Inline Memory Module (DIMM) and non-volatile memory of the DIMM via a single memory slot based at least in part on a chip select signal,
wherein the chip select signal indicates whether a memory access from a processor is directed at the volatile memory or the non-volatile memory, wherein a Basic Input Output System (BIOS) configures a memory controller at boot time based on memory map information, wherein the BIOS is to generate the memory map information based on data stored in the volatile memory.

16. The method of claim 15, further comprising causing modification to an operational characteristic of one of the volatile memory or the non-volatile memory based at least in part on information to be detected at one or more sensors.

17. The method of claim 16, further comprising the one or more sensors detecting variations in one or more of: temperature, power consumption, power dissipation, current draw, or voltage draw.

18. The method of claim 16, wherein the one or more sensors comprise at least one Thermal Sensor On Die (TSOD).

19. The method of claim 15, further comprising communicating data between the processor, having one or more processor cores, and the DIMM via the single memory slot, wherein the DIMM appears to the processor as a single DIMM.

20. The method of claim 15, further comprising addressing each of the volatile memory and the non-volatile memory.

21. The method of claim 15, further comprising directing data to or from one of the volatile memory or the non-volatile memory.

22. The method of claim 15, wherein the non-volatile memory comprises one or more of: nanowire memory, Ferro-electric Transistor Random Access Memory (Fe-TRAM), Magnetoresistive Random Access Memory (MRAM), flash memory, Spin Torque Transfer Random Access Memory (STTRAM), Resistive Random Access Memory, byte addressable 3-Dimensional Cross Point Memory, PCM (Phase Change Memory), and volatile memory backed by a power reserve to retain data during power failure or power disruption.

23. The method of claim 15, further comprising communicating data between one or more network interfaces and the DIMM.

24. A computer system comprising:
a display device;
a Dual Inline Memory Module (DIMM), coupled to the display device, the DIMM to comprise volatile memory and non-volatile memory,
wherein data is to be communicated with the volatile memory and the non-volatile memory via a single memory slot based at least in part on a chip select signal, wherein the chip select signal is to indicate whether a memory access from a processor is to be directed at the volatile memory or the non-volatile memory, wherein a Basic Input Output System (BIOS) is to configure a memory controller at boot time based on memory map information, wherein the BIOS is to generate the memory map information based on data stored in the volatile memory.

25. The computer system of claim 24, comprising logic to cause modification to an operational characteristic of one of the volatile memory or the non-volatile memory based at least in part on information to be detected at one or more sensors.

26. The computer system of claim 24, comprising logic to communicate data between the processor, having one or more processor cores, and the DIMM via the single memory slot, wherein the DIMM is to appear to the processor as a single DIMM.

27. The computer system of claim 24, wherein each of the volatile memory and the non-volatile memory are to be addressable.

28. The computer system of claim 24, comprising logic to direct data to or from one of the volatile memory or the non-volatile memory.

29. The computer system of claim 24, comprising one or more of: at least one processor communicatively coupled to the DIMM, a battery communicatively coupled to the computer system, or a network interface communicatively coupled to the computer system.

* * * * *